(12) United States Patent
Pranatharthiharan et al.

(10) Patent No.: US 10,304,747 B2
(45) Date of Patent: May 28, 2019

(54) DUAL LINER SILICIDE

(71) Applicants: INTERNATIONAL BUSINESS MACHINES CORPORATION, Armonk, NY (US); GLOBALFOUNDRIES Inc, Grand Cayman (KY)

(72) Inventors: Balasubramanian Pranatharthiharan, Watervliet, NY (US); Ruilong Xie, Niskayuna, NY (US); Chun-Chen Yeh, Clifton Park, NY (US)

(73) Assignees: INTERNATIONAL BUSINESS MACHINES CORPORATION, Armonk, NY (US); GLOBALFOUNDRIES INC, Grand Cayman (KY)

( * ) Notice: Subject to any disclaimer, the term of this patent is extended or adjusted under 35 U.S.C. 154(b) by 0 days.

(21) Appl. No.: 15/847,028

(22) Filed: Dec. 19, 2017

(65) Prior Publication Data

US 2018/0122711 A1 May 3, 2018

Related U.S. Application Data

(63) Continuation of application No. 15/366,223, filed on Dec. 1, 2016, now Pat. No. 9,929,059, which is a
(Continued)

(51) Int. Cl.
*H01L 29/08* (2006.01)
*H01L 21/8238* (2006.01)
(Continued)

(52) U.S. Cl.
CPC ........... *H01L 21/823871* (2013.01); *H01L 21/76897* (2013.01); *H01L 21/823814* (2013.01);
(Continued)

(58) Field of Classification Search
None
See application file for complete search history.

(56) References Cited

U.S. PATENT DOCUMENTS 6,495,460 B1 12/2002 Bertrand et al.
7,067,368 B1 6/2006 Fang et al.
(Continued)

OTHER PUBLICATIONS

Strane, J. et al., "Implementation of Robust Nickel Alloy Salicide Process for High-Performance 65nm SOI CMOS Manufacturing," International Symposium on VLSI Technology, Systems and Applications, Apr. 2007. (pp. 1-2).
(Continued)

*Primary Examiner* — Reema Patel
*Assistant Examiner* — Steven M Christopher
(74) *Attorney, Agent, or Firm* — Tutunjian & Bitetto, P.C.; Vazken Alexanian

(57) ABSTRACT

A method for fabricating a dual silicide device includes growing source and drain (S/D) regions for an N-type device, forming a protection layer over a gate structure and the S/D regions of the N-type device and growing S/D regions for a P-type device. A first dielectric layer is conformally deposited and portions removed to expose the S/D regions. Exposed S/D regions for the P-type device are silicided to form a liner. A second dielectric layer is conformally deposited. A dielectric fill is formed over the second dielectric layer. Contact holes are opened through the second dielectric layer to expose the liner for the P-type device and expose the protection layer for the N-type device. The S/D regions for the N-type device are exposed by opening the protection layer. Exposed S/D regions adjacent to the gate structure are silicided to form a liner for the N-type device. Contacts are formed.

17 Claims, 11 Drawing Sheets

Related U.S. Application Data continuation of application No. 14/740,987, filed on Jun. 16, 2015, now Pat. No. 9,564,372.

(51) Int. Cl.
*H01L 29/66* (2006.01)
*H01L 27/092* (2006.01)
*H01L 29/417* (2006.01)
*H01L 29/45* (2006.01)
*H01L 23/522* (2006.01)
*H01L 21/768* (2006.01)
*H01L 21/285* (2006.01)

(52) U.S. Cl.
CPC .. *H01L 21/823864* (2013.01); *H01L 23/5226* (2013.01); *H01L 27/092* (2013.01); *H01L 29/0847* (2013.01); *H01L 29/41725* (2013.01); *H01L 29/456* (2013.01); *H01L 29/665* (2013.01); *H01L 29/6653* (2013.01); *H01L 29/66545* (2013.01); *H01L 29/66628* (2013.01); *H01L 21/28518* (2013.01)

(56) References Cited

U.S. PATENT DOCUMENTS

| | | | |
|---|---|---|---|
| 7,446,062 B2 | 11/2008 | Chidambarrao et al. | |
| 7,517,767 B2 | 4/2009 | Dyer et al. | |
| 7,960,223 B2 | 6/2011 | Chen et al. | |
| 8,278,200 B2 | 10/2012 | Lavoie et al. | |
| 9,093,424 B2* | 7/2015 | Breil | H01L 21/32051 |
| 9,177,810 B2* | 11/2015 | Basker | H01L 21/283 |
| 2006/0163670 A1 | 7/2006 | Ellis-Monaghan et al. | |
| 2007/0123042 A1 | 5/2007 | Rim et al. | |
| 2009/0309164 A1* | 12/2009 | Chen | H01L 21/823807 257/369 |
| 2011/0147855 A1 | 6/2011 | Joshi et al. | |
| 2014/0210011 A1* | 7/2014 | Baraskar | H01L 21/823814 257/369 |
| 2014/0306290 A1 | 10/2014 | Alptekin et al. | |
| 2015/0318213 A1* | 11/2015 | Tsai | H01L 29/42376 257/9 |
| 2016/0247805 A1* | 8/2016 | Basker | H01L 21/823814 |
| 2017/0092726 A1 | 3/2017 | Nidhi et al. | |

OTHER PUBLICATIONS

Office Action issued in U.S. Appl. No. 15/240,554 dated Jul. 28, 2017, pp. 1-19.
List of IBM Patents or Patent Applications Treated as Related dated Dec. 19, 2017, 2 pages.

* cited by examiner

DUAL LINER SILICIDE

BACKGROUND

Technical Field

The present invention relates to semiconductor devices and processing, and more particularly to dual liner silicides for complementary metal oxide semiconductor (CMOS) devices.

Description of the Related Art

Complementary metal oxide semiconductor (CMOS) processing is often different for N-type field effect transistors (NFETs) versus P-type field effect transistors (PFETs). This is pertinent for silicided liners formed for landing contacts in both the NFETs and the PFETs. The dual silicide refers to the formation of silicided contact liners for both NFETs and PFETs in a single process flow. Conventional ways to form dual liner silicides include the following techniques.

In one method, a contact trench is formed and a first liner material is deposited for the NFET. Then, a mask is formed over the first liner material, and the first liner material is removed from the PFET. A second liner material is formed for the PFET. Then, metallization is formed from both the NFET and PFET. In this method, a metal liner is exposed to ash and the first liner material can undergo metal mixing with the PFET source and drain (S/D) regions.

In another method, a contact trench is formed followed by a first liner material being deposited, followed by a metal fill (e.g., Tungsten, or other sacrificial material). The metal fill and the first liner material are removed from the PFET. A second liner material is deposited and metallization is formed. In this method, as before, the first liner material can metal mix with the PFET S/D regions.

In another method, contacts are formed for the NFET and the PFET. The NFET contacts are etched and a first liner and metal fill are performed. Then, the PFET contacts are etched and a second liner and metal fill are performed. At least 2 additional lithography steps are needed in this method.

SUMMARY

A method for fabricating a dual silicide device includes growing source and drain regions adjacent to a gate structure for an N-type device, forming a protection layer over the gate structure and the source and drain regions of the N-type device and growing source and drain regions adjacent to a gate structure for a P-type device. A first dielectric layer is conformally deposited. The first dielectric layer is removed to expose the source and drain regions adjacent to the gate structure for the P-type device and exposed source and drain regions adjacent to the gate structure for the P-type device are silicided to form a silicided liner for the P-type device. A second dielectric layer is conformally deposited. A dielectric fill is formed over the second dielectric layer. Contact holes are opened in the dielectric fill and through the second dielectric layer to expose the silicided liner for the P-type device and expose the protection layer for the N-type device. The source and drain regions adjacent to the gate structure for the N-type device are exposed by opening the protection layer, and exposed source and drain regions adjacent to the gate structure for the N-type device are silicided to form a silicided liner for the N-type device. Contacts are formed in the contact holes down to the silicided liners of the P-type device and the N-type device.

A method for fabricating a dual silicide device includes forming spacers on dummy gate structures; growing source and drain regions adjacent to the spacers for an N-type device; forming a protection layer over the spacers and the source and drain regions of the N-type device; growing source and drain regions adjacent to the spacers for a P-type device; conformally depositing a first dielectric layer; recessing the first dielectric layer to expose top portions of the spacers; exposing and removing the dummy gate structures to form gate openings; forming gate dielectric and gate conductors in the gate openings; removing the first dielectric layer to expose the source and drain regions adjacent to the spacers for the P-type device; siliciding exposed source and drain regions adjacent to the spacers for the P-type device to form a silicided liner for the P-type device; conformally depositing a second dielectric layer; forming a flowable dielectric over the second dielectric layer; opening contact holes in the flowable dielectric and through the second dielectric layer to expose the silicided liner for the P-type device; exposing the source and drain regions adjacent to the spacers for the N-type device by opening the protection layer; siliciding exposed source and drain regions adjacent to the spacers for the N-type device to form a silicided liner for the N-type device; and forming contacts in the contact holes down to the silicided liners of the P-type device and the N-type device.

A dual silicide complementary metal oxide semiconductor (CMOS) device includes a P-type device including source and drain regions on opposite sides of a gate structure and being disposed over a substrate, the source and drain regions including a horizontal portion and a vertical portion. A first silicided liner is formed over the horizontal portion and the vertical portion of the source and drain regions of the P-type device. An N-type device includes source and drain regions on opposite sides of a gate structure and disposed over the substrate. The source and drain regions include a horizontal portion and a vertical portion. A second silicided liner is formed on a portion of the horizontal portion of the source and drain regions of the N-type device. A high-k dielectric layer covers the vertical portion and at least a portion of the horizontal portion of the source and drain regions of the P-type device and the N-type device. A protection layer covers the vertical portion and at least a portion of the horizontal portion of the source and drain regions of the N-type device. First contacts connect to the first silicided liner through the high-k dielectric layer, and second contacts connect to the second silicided liner through the high-k dielectric layer and the protection layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
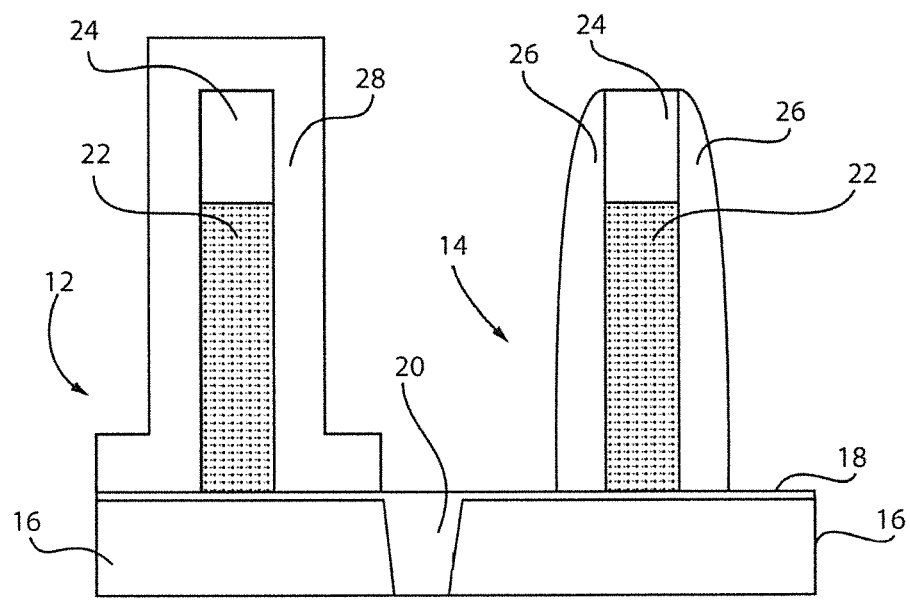
FIG. 1 is a cross-sectional view of a complementary metal oxide semiconductor (CMOS) device showing a gate structure for an NFET processed to form spacers in accordance with the present principles.

In accordance with the present principles, dual liner silicide methods and devices are provided. A dual liner silicide provides an efficient workflow and assists in optimizing performance of both N-type field effect transistors (NFETs) and P-type field effect transistors (PFETs) in complementary metal oxide semiconductor (CMOS) processing. One way of achieving improved performance is the protection of sensitive components from harsh ashing processes. In addition, the patterning of metals for siliciding is avoided by self-aligned processes that employ protective layers integrated into the process flow. The integration of the formation of these layers also helps to reduce the number of lithographic processes that are needed. For example, the present embodiments reduce the exposure to ash in metal materials and reduce the risk of metal mixing in source and drain (S/D) regions. The protective layers are self-aligned to provide protection from ash exposure and metal mixing without the need for additional lithographic processing.

The present principles form dual suicides for CMOS devices without having to pattern metal liner materials, so there is no ash impact or metal intermixing concerns. In addition, no additional lithographic masks are needed. Instead, the patterning processes utilize structures formed during spacer formation or epitaxial formation of source and drain regions.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view is shown for a partially fabricated CMOS device 10 in accordance with one embodiment. CMOS device 10 includes a PFET 12 and an NFET 14. The PFET 12 and NFET 14 are formed in a same substrate 16. The substrate 16 is appropriately doped to form wells for the respective devices (PFET 12, NFET 14). The substrate 16 may include a Si substrate, although other materials, may be employed, e.g., SiGe, SiC, etc. A dummy dielectric layer 18, such as an oxide, is formed over the substrate 16 and shallow trench isolation (STI) structures 20 may also be formed between devices. STI structures 20 may include an oxide.

A dummy gate structure 22 is formed over the dummy dielectric 18. The dummy gate structure 22 is patterned by forming a hard mask 24 (e.g., SiN) over the dummy gate structure 22 and patterning the hard mask 24. The gate structure 22, which may include polysilicon, is then etched, by e.g., a reactive ion etch (RIE) process. The dummy gate structure 22 remains coated with a spacer dielectric 28 (e.g., SiN). The PFET 12 is protected while the spacer dielectric 28 is etched over the NFET 14 to form spacers 26.

Figure 2:
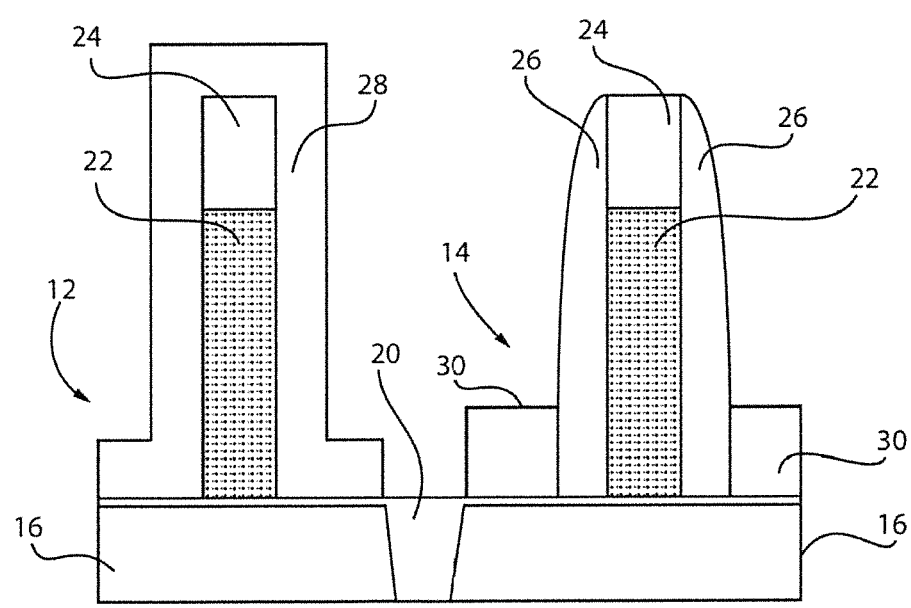
FIG. 2 is a cross-sectional view of the device of FIG. 1 showing epitaxial growth of source/drain (S/D) structures on the NFET in accordance with the present principles.

Referring to FIG. 2, the dummy dielectric 18 is removed from portions of the substrate 16 where the NFET 14 is formed. A lithographic process is not needed since the PFET 12 is already protected by spacer dielectric 28; however, a photolithographic mask may be placed over the PFET 12 in an alternate embodiment. The dummy dielectric 18 removal exposes a clean surface of the substrate 16 for the NFET 14. An epitaxial growth process is employed to grow a monocrystalline structure 30 for the NFET 14. The structure 30 may include S/D regions or extensions of S/D regions. The structure 30 may include the same material as the substrate 16 or may include a material having a similar or same lattice structure as the substrate 16. The structure 30 may be doped in-situ or may be doped by implantation, diffusion or other process.

Figure 3:
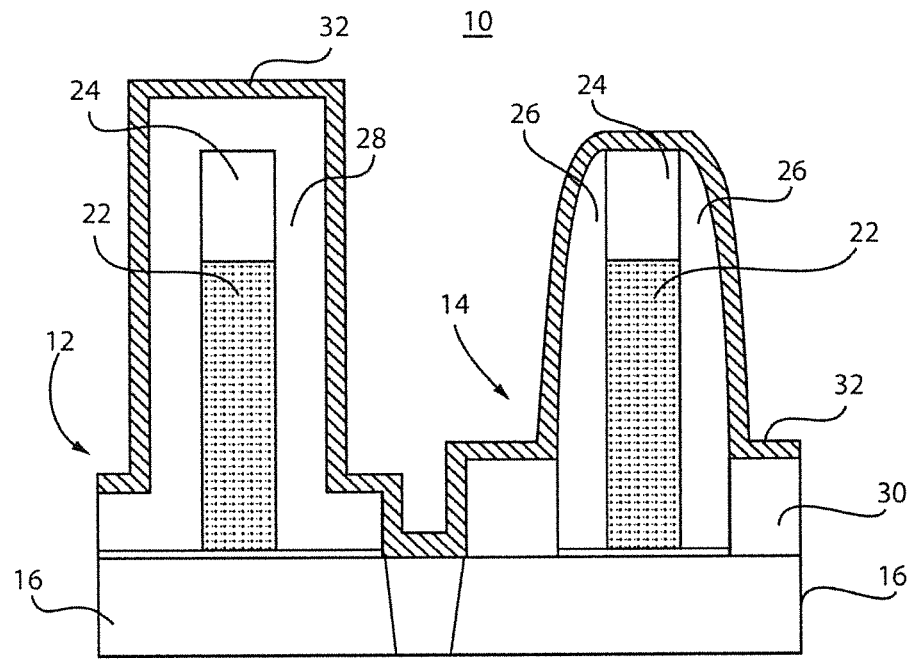
FIG. 3 is a cross-sectional view of the device of FIG. 2 showing a protection layer formed in accordance with the present principles.

Referring to FIG. 3, a protection layer 32 is deposited over the device 10 to protect the deposited material for structure 30. The protection layer 32 may include a thin layer, e.g., about 3 nm, of SiN or other dielectric material. The protection layer 32 protects the structure 30 from future processing as will be described.

Figure 4:
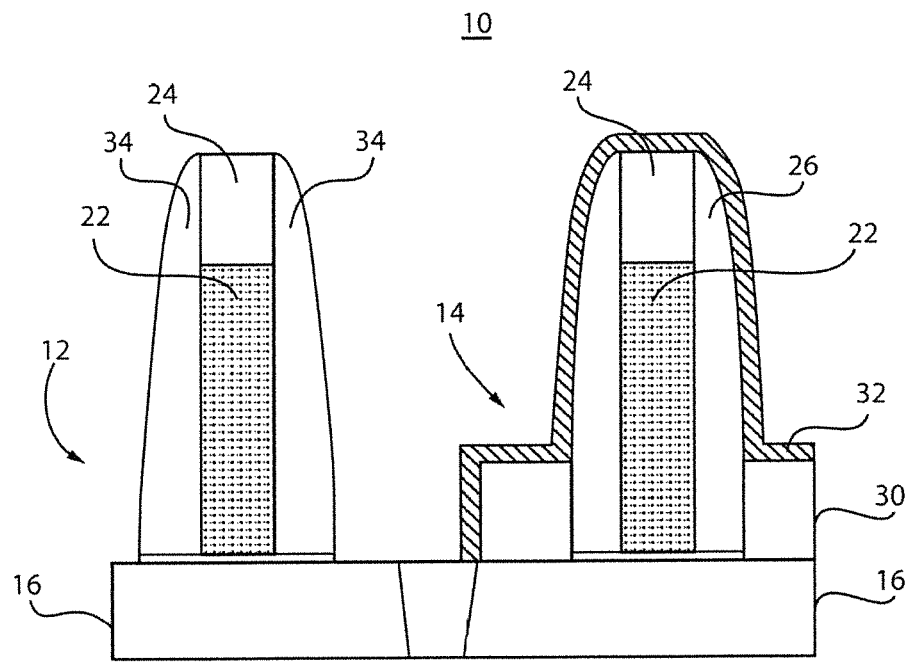
FIG. 4 is a cross-sectional view of the device of FIG. 3 showing a spacer formed on a PFET in accordance with the present principles.

Referring to FIG. 4, the NFET 14 is masked to permit etching of the PFET 12. The PFET 12 is etched using a RIE process which removes layer 32 and begins to etch away layer 28 to form spacers 34.

Figure 5:
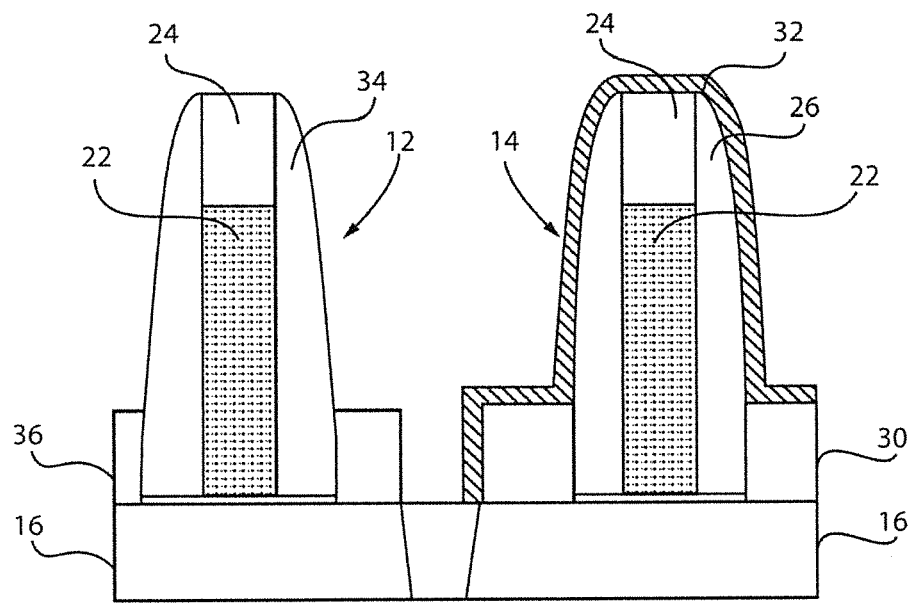
FIG. 5 is a cross-sectional view of the device of FIG. 4 showing epitaxial growth of source/drain (S/D) structures on the PFET in accordance with the present principles.

Referring to FIG. 5, the dummy dielectric 18 is removed from portions of the substrate 16 where the PFET 12 is formed during the spacer formation process in FIG. 4. A lithographic process is not needed since the NFET 14 is already protected by protection layer 32. The dummy dielectric 18 removal exposes a clean surface of the substrate 16 for the PFET 16.

An epitaxial growth process is employed to grow a monocrystalline structure 36 for the PFET 12. The structure 36 may include S/D regions or extensions of S/D regions. The structure 36 may include the same material as the substrate 16 or may include a material having a similar or same lattice structure as the substrate 16. The structure 36 may be doped in-situ or may be doped by implantation, diffusion or other process.

Figure 6:
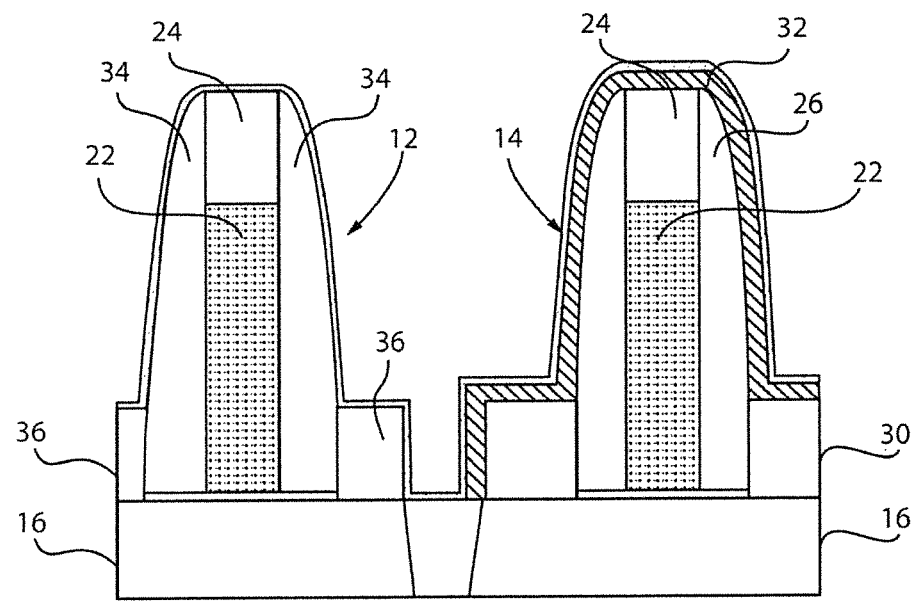
FIG. 6 is a cross-sectional view of the device of FIG. 5 showing a dielectric layer (e.g., high-k) formed in accordance with the present principles.

Referring to FIG. 6, a high-k dielectric layer 38 is conformally formed over the device 10. The dielectric layer may include a material such as $HfO_2$ or similar material. The dielectric layer 38 is formed as a thin material over the NFET 14 and the PFET 12. The high-k dielectric layer 38 may include a thickness of between about 2-10 nm.

Figure 7:
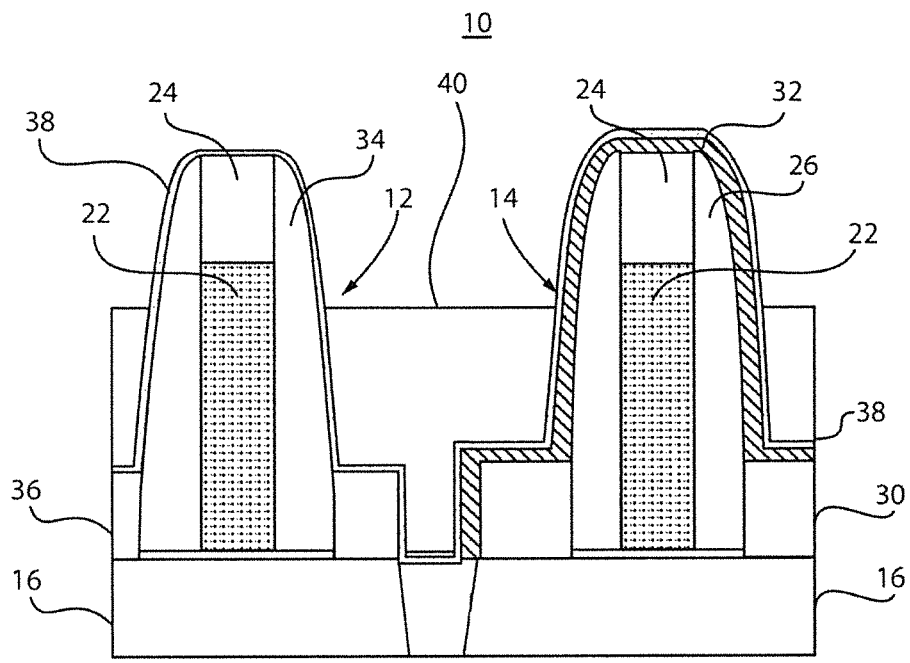
FIG. 7 is a cross-sectional view of the device of FIG. 6 showing an organic planarizing layer (OPL) fill and recess in accordance with the present principles.

Referring to FIG. 7, the device 10 is buried in a planarizing layer 40. The planarizing layer 40 may include a dielectric material and in particular may include an organic planarizing layer (OPL). Once deposited, the planarizing layer 40 is subjected to an etch process to recess the planarizing layer 40 down to a height 42. This exposes portions of the dielectric layer 38.

Figure 8:
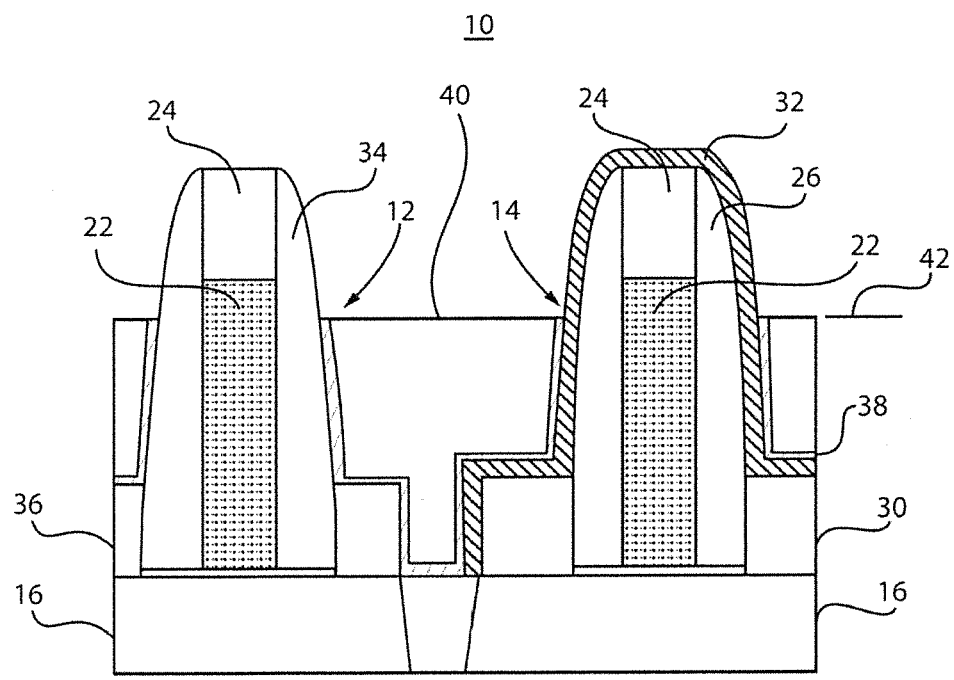
FIG. 8 is a cross-sectional view of the device of FIG. 7 showing the dielectric layer removed above the OPL fill in accordance with the present principles.

Referring to FIG. 8, the exposed portions of the dielectric layer 38 are removed by performing an etch process. Portions of the dielectric layer 38 above the height 42 are removed to expose spacers 34 for the PFET 12 and expose layer 32 for the NFET 14.

Figure 9:
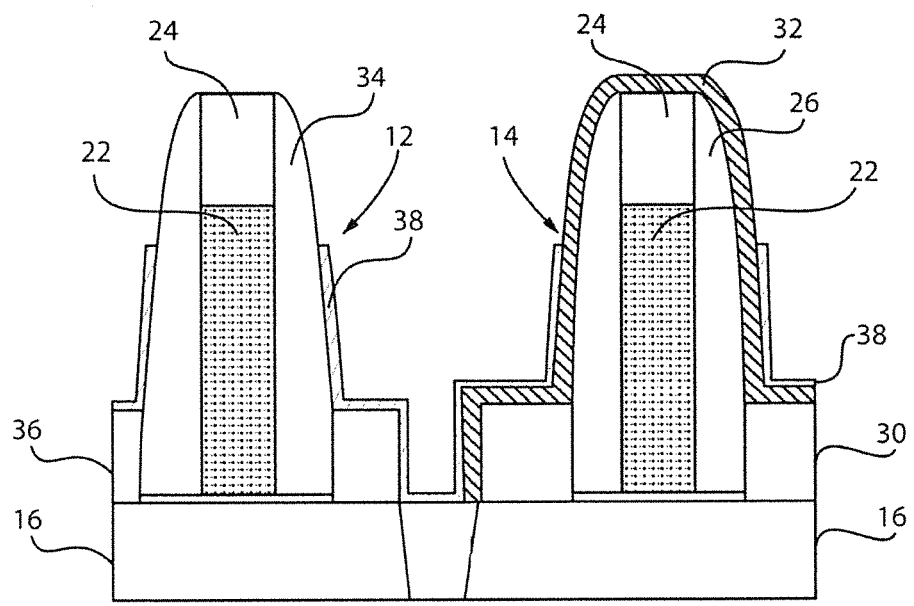
FIG. 9 is a cross-sectional view of the device of FIG. 8 showing the OPL removed in accordance with the present principles.

Referring to FIG. 9, the planarizing layer 40 is removed. In one embodiment, the planarizing layer includes an OPL, and the organic material is removed by an ashing process. The dielectric layer 38 protects a lower portion of the spacers 34 and the epitaxially grown structure 36 on PFET 12, and the layers 32 and 38 protect epitaxially grown structure 36 on NFET 14 from the ash process.

Figure 10:
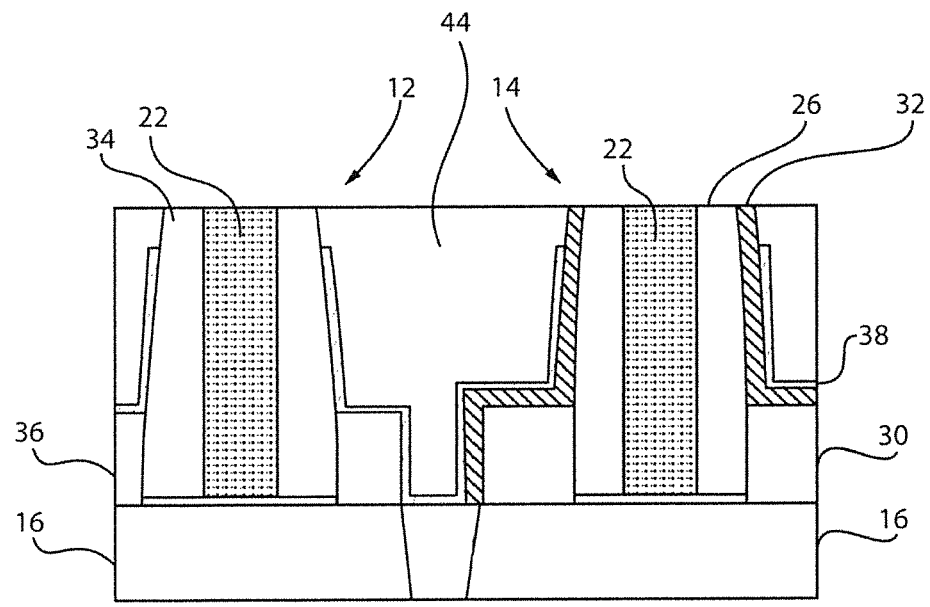
FIG. 10 is a cross-sectional view of the device of FIG. 9 showing a dielectric fill and planarization to dummy gates in accordance with the present principles.

Referring to FIG. 10, an overfill material 44 is formed. The overfill material 44 may include an oxide or other dielectric material. The overfill material 44 fills in spaces between structures on the device 10. A planarizing process is performed, such as a chemical mechanical polish (CMP). The planarizing process removes the hard mask 24 from over the dummy gate structure 22. The dummy gate structure 22 is now exposed to enable replacement of the dummy gate structure 22 with a conductive material. The planarizing process preferably remains above the dielectric layer 38.

Figure 11:
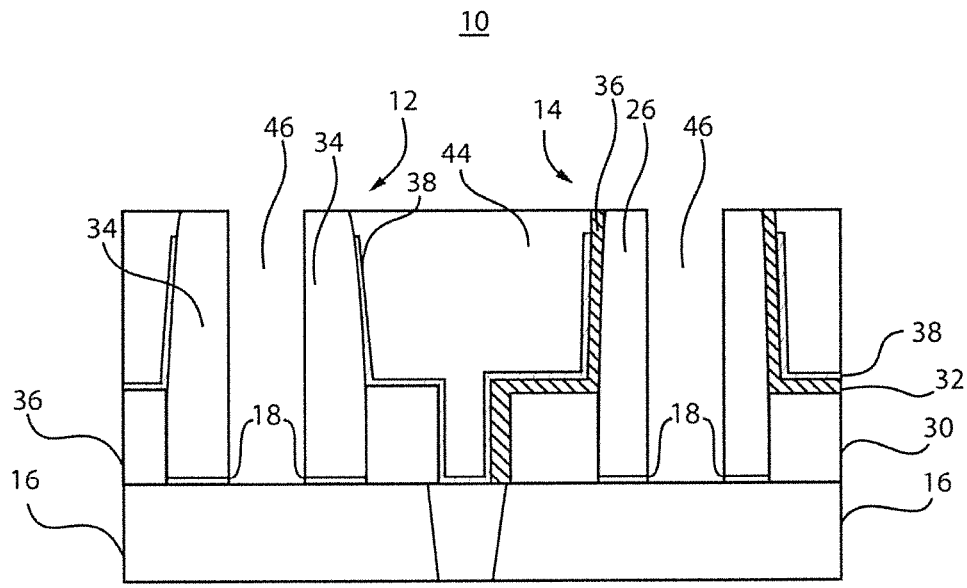
FIG. 11 is a cross-sectional view of the device of FIG. 10 showing gate openings formed by removing dummy materials in accordance with the present principles.

Referring to FIG. 11, the dummy gate structure 22 is removed, and the dummy dielectric 18 is etched in the openings 44 formed by the dummy gate structure 22 removal. This exposes the substrate 16 at the PFET 12 and at the NFET 14.

Figure 12:
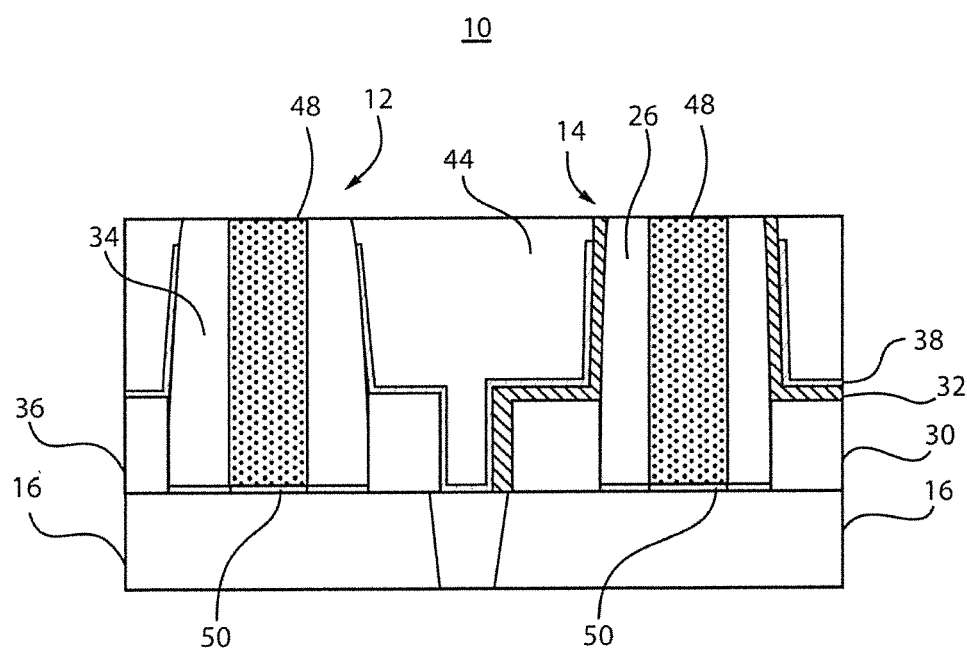
FIG. 12 is a cross-sectional view of the device of FIG. 11 showing gate openings filled with gate dielectric and conductors in accordance with the present principles.

Referring to FIG. 12, a gate dielectric 50 is formed on the substrate within each opening 44 (FIG. 11). The gate dielectric 50 may include a silicon oxide or a high-k dielectric material (e.g., $HfO_2$). A gate conductor 48 is deposited in each opening 44 (FIG. 11). The gate conductor 48 may include a metal (e.g., W, Cu, Ag, Au, etc.). A planarizing process (e.g., CMP) is employed to remove material for the gate dielectric 50 and the gate conductor 48 from a top surface of the device 10.

Figure 13:
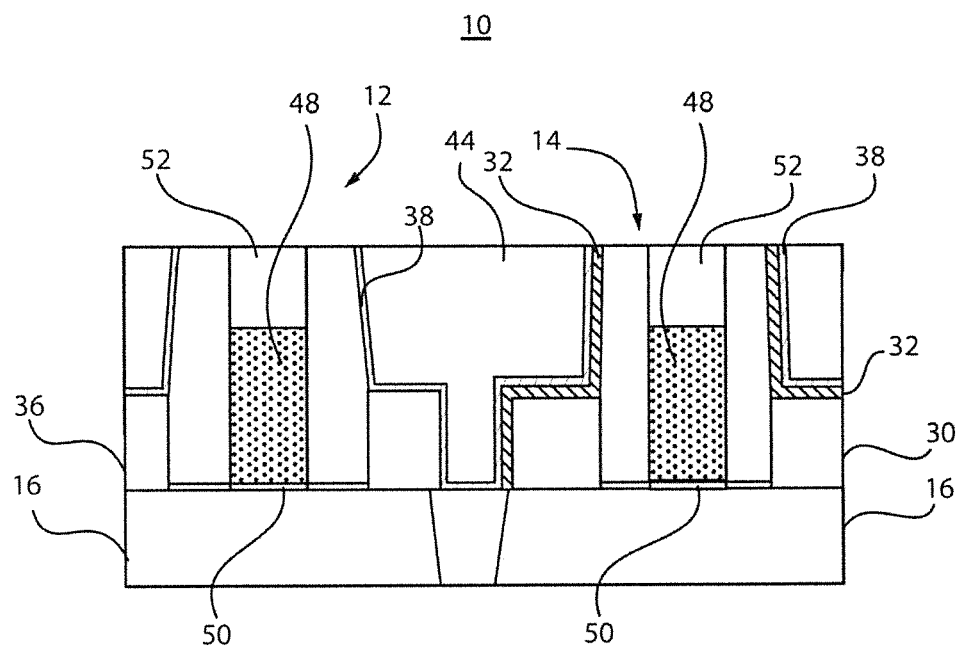
FIG. 13 is a cross-sectional view of the device of FIG. 12 showing gate conductors recessed and a cap dielectric formed in accordance with the present principles.

Referring to FIG. 13, the gate conductors 48 are recessed to make room for a dielectric cap 52 on each gate structure (PFET 12 and NFET 14). The dielectric cap 52 may include SiN, although other materials may be employed. The dielectric cap 52 may be formed using a high density plasma (HDP) process. The dielectric cap 52 is deposited and then planarized. The planarization process may take a top surface down to the layer 38.

Figure 14:
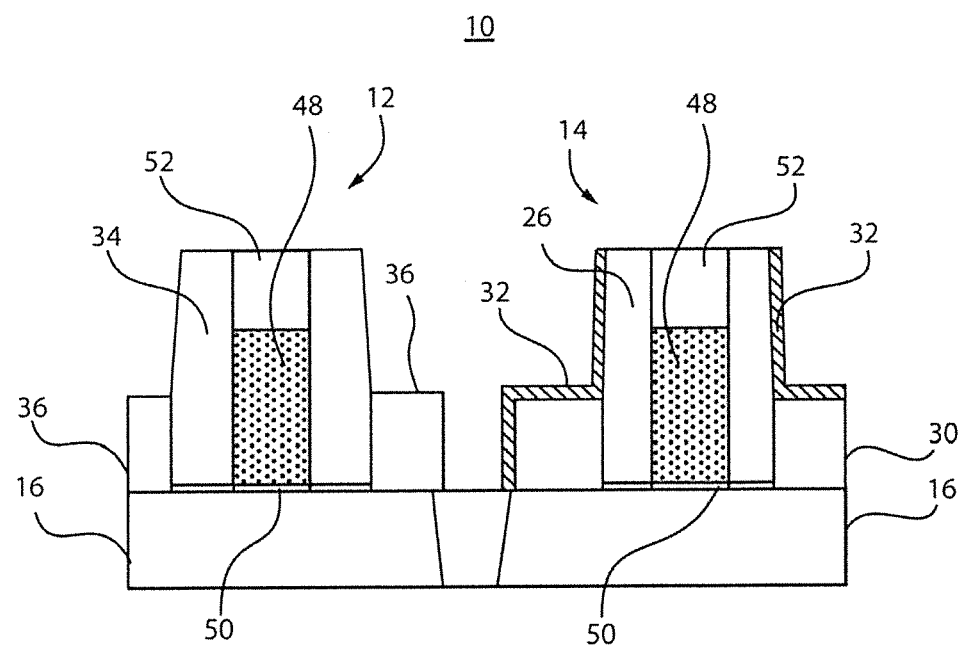
FIG. 14 is a cross-sectional view of the device of FIG. 13 showing the dielectric layer (high-k) removed in accordance with the present principles.

Referring to FIG. 14, the overfill material 44 is removed selective to the dielectric layer 38 and the material of the spacers 26, 34 and caps 52. The spacers 26, 34 and caps 52 may include. SiN. A wet etch with buffered HF may be employed. Then, the layer 38 is selectively removed relative to the spacers 26, 34 and caps 52, the structure 36, STI 20 and layer 32.

Figure 15:
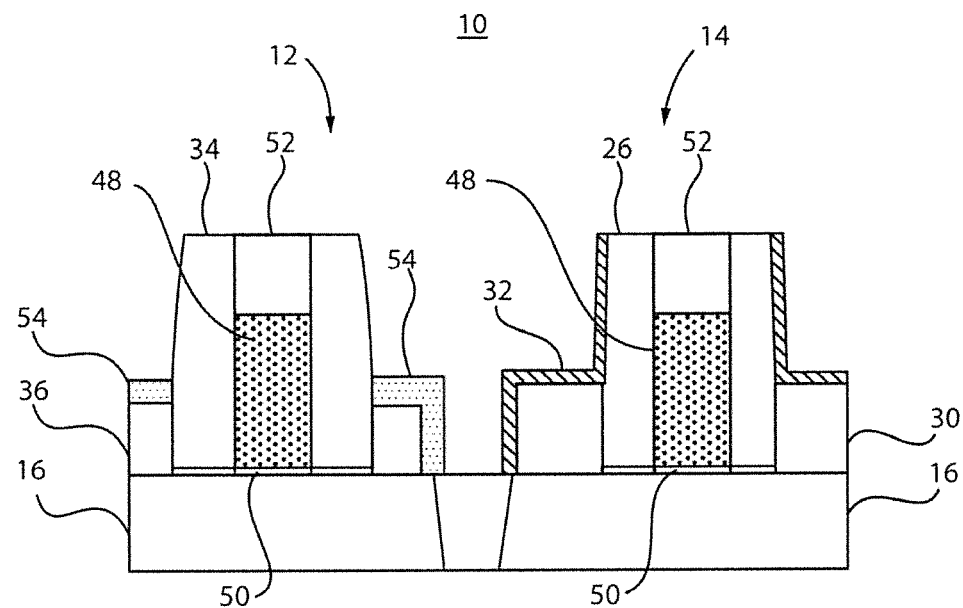
FIG. 15 is a cross-sectional view of the device of FIG. 14 showing a silicide (salicide) formed on the S/D regions of the PFET in accordance with the present principles.

Referring to FIG. 15, exposed portions of the structure 36 of the PFET 12 is silicided. The silicide is self-aligned and may be referred to as a salicide (self-aligned silicide). A silicided region or liner 54 may include Ni, Pt, NiPt, or other metals and their alloys that can mix with the material of structure 36 (e.g., silicon). The silicided region or liner 54 extends over a horizontal surface and a vertical surface of the structure 36.

Figure 16:
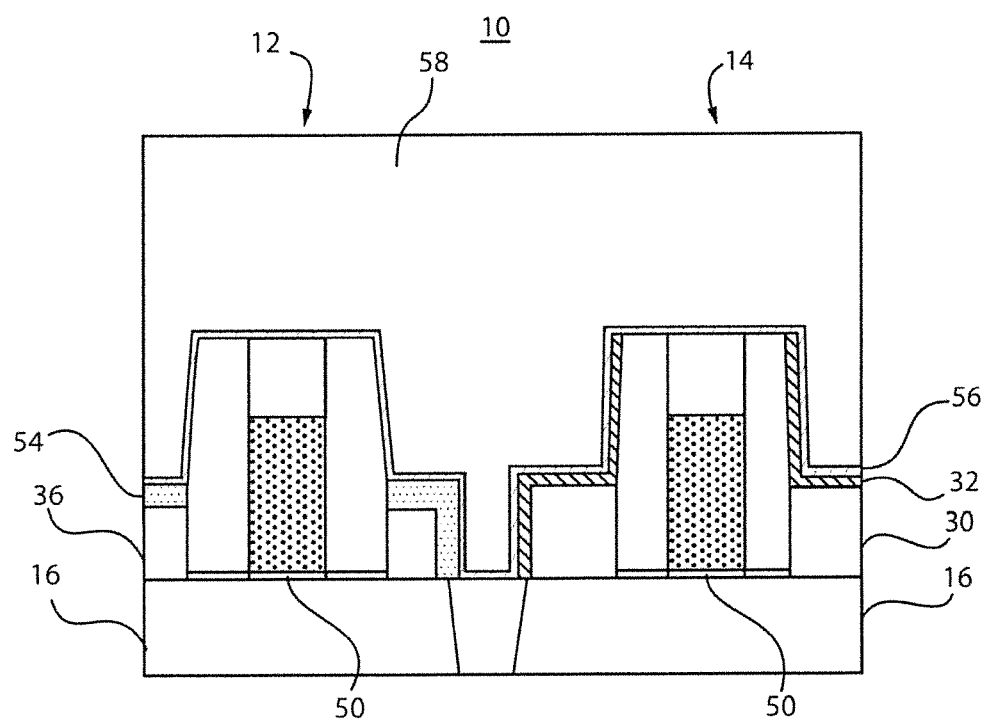
FIG. 16 is a cross-sectional view of the device of FIG. 15 showing a second dielectric layer conformally formed and a flowable dielectric layer blanket deposited in accordance with the present principles.

Referring to FIG. 16, a dielectric layer 56, e.g., a high-k dielectric, such as $HfO_2$, is conformally deposited. A flowable dielectric 58 is formed over the dielectric layer 58. The flowable dielectric 58 may include a flowable oxide material. The dielectric layer 56 may include a thickness of between about 2-10 nm.

Figure 17:
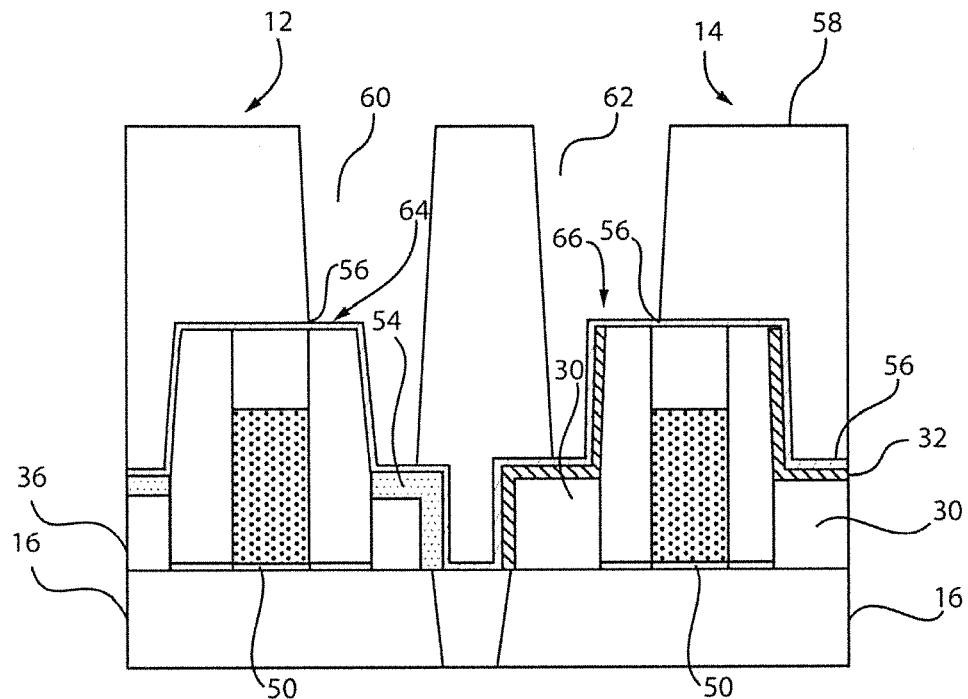
FIG. 17 is a cross-sectional view of the device of FIG. 16 showing a contact etch with zero corner loss for the gate structures in accordance with the present principles.

Referring to FIG. 17, the flowable dielectric 58 is patterned to form openings 60, 62 down to the dielectric layer 56 over the structure 36 for the PFET 12 and over the structure 30 for the NFET 14. The openings 60, 62 are formed by performing a contact etch process selective to the dielectric layer 56. The dielectric layer 56 provides a zero corner loss for gate structures 64, 66.

Figure 18:
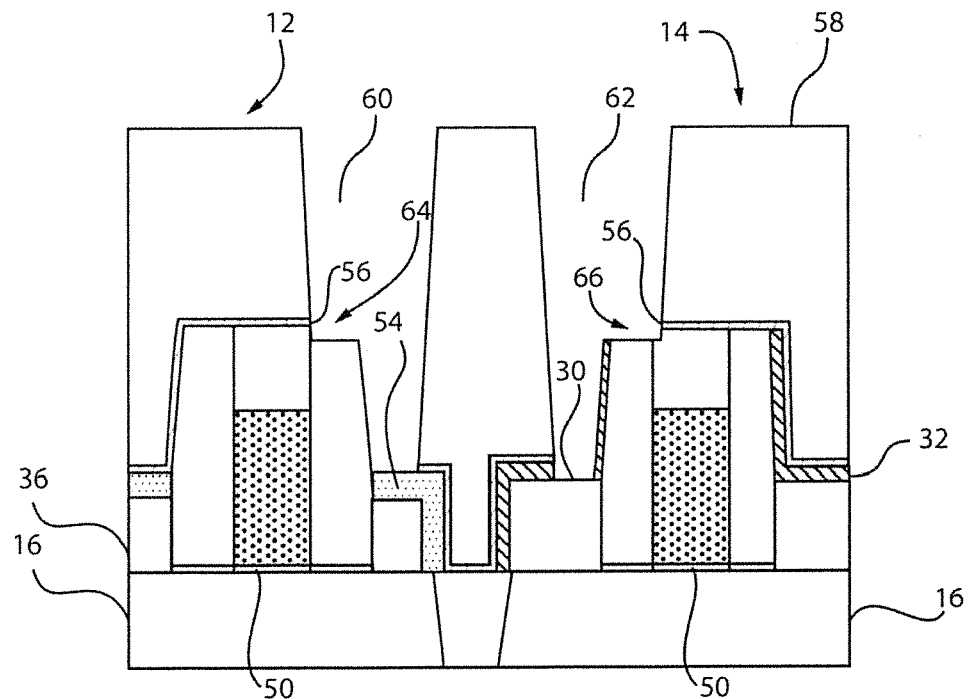
FIG. 18 is a cross-sectional view of the device of FIG. 17 showing an etch to expose the PFET silicide and the NFET S/D regions in accordance with the present principles.

Referring to FIG. 18, a selective etch is performed to remove the dielectric layer 56 from gate structures 64, 66 in areas exposed within contact openings 60, 62. Then, another etch process exposes structure 30 in opening 62 by removing a portion of layer 32. Some etching of the gate structures 64 and 66 occurs as well.

Figure 19:
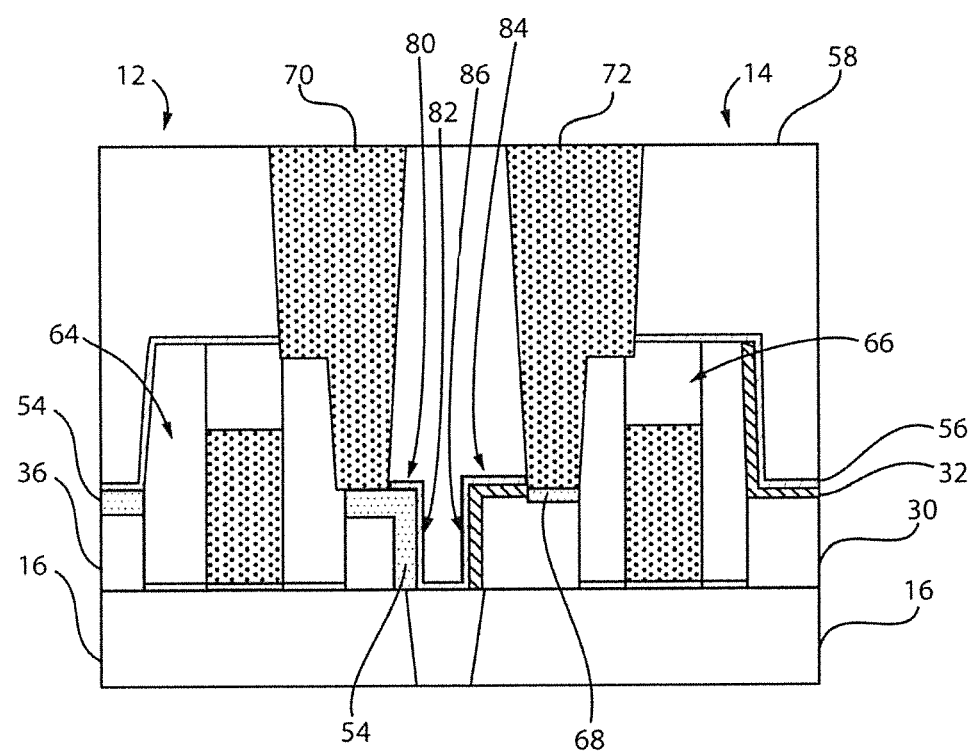
FIG. 19 is a cross-sectional view of the device of FIG. 18 showing silicide (salicide) formation on the NFET S/D regions and contact fill in accordance with the present principles.

Referring to FIG. 19, a silicided region or liner (salicide) 68 is formed in an exposed portion of the structure 30 within opening 62 (FIG. 18). In one embodiment, the silicided region is formed by introducing Ti, or similar metals or their alloys into the structure 30. The openings 60, 62 are then filled with a conductive material, such as a metal, to form contacts 70, 72. In one embodiment, the metal for contacts 70, 72 includes W, although other metals and alloys may be employed. Contacts are illustratively depicted on one side of the devices but may be included on both sides of the gate structures 64 and 66. Processing may continue with the formation of additional metal layers and dielectric interlayers, as needed.

In accordance with the present principles, a dual silicide complementary metal oxide semiconductor (CMOS) device 10 includes the P-type device 12 including source and drain regions 36 on opposite sides of a gate structure 64 disposed over the substrate 16. The source and drain regions 36 include a horizontal portion 80 and a vertical portion 82 opposite the gate structure 64. A first silicided liner 54 is formed over the horizontal portion 80 and the vertical portion 82 of the source and drain regions of the P-type device 12.

The N-type device 14 includes source and drain regions 30 on opposite sides of a gate structure 66 and disposed over the substrate 16. The source and drain regions 30 include a horizontal portion 84 and a vertical portion 86 opposite the gate structure 66. A second silicided liner 68 is formed on a portion of the horizontal portion 84 of the source and drain regions 30 of the N-type device 14. The high-k dielectric layer 56 covers the vertical portions 82, 86 and at least a portion of the horizontal portions 80,84 of the source and drain regions of the P-type device 12 and the N-type device 14. The protection layer 32 covers the vertical portion 86 and at least a portion of the horizontal portion 84 of the source and drain regions 30 of the N-type device 14.

First contacts 70 connect to the first silicided liner 54 through the high-k dielectric layer 56, and second contacts 72 connect to the second silicided liner 68 through the high-k dielectric layer 56 and the protection layer 32. The first silicided liner may include at least one of Ni, Pt or a combination thereof. The second silicided liner may include Ti. In one embodiment, the vertical surface 82 of the P-type 12 device faces the vertical surface 86 of the N-type device 14 between the devices such that the vertical surfaces 82, 86 are separated by at least two thicknesses of the high-k dielectric layer 56 and the protection layer 32. The high-k dielectric layer 56 may include $HfO_2$, and the protection layer 32 may include SiN, although other materials are contemplated.

Figure 20:
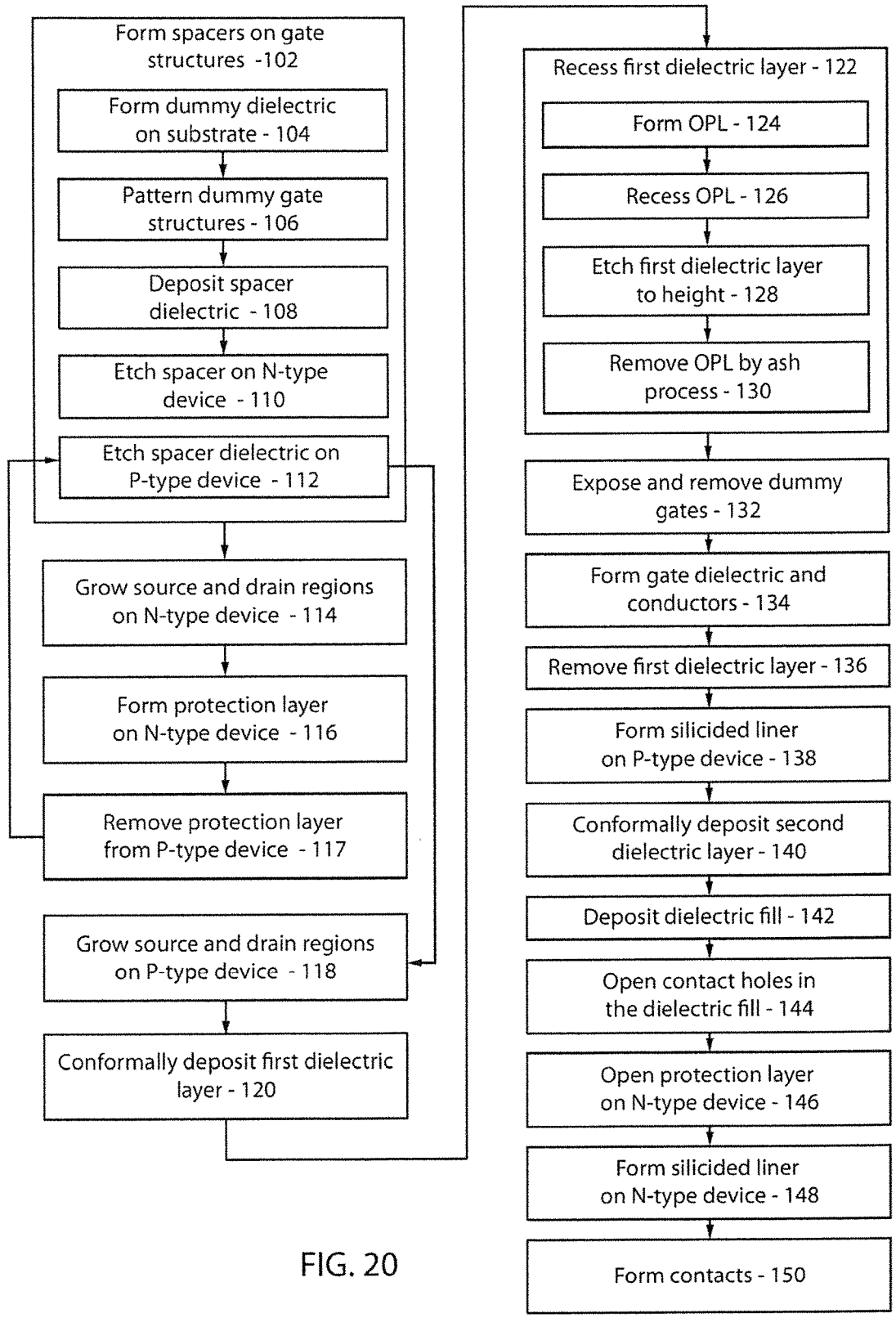
FIG. 20 is a block/flow diagram showing a method for fabrication of a dual silicide device in accordance with illustrative embodiments.

Referring to FIG. 20, a method for fabricating a dual silicide device is illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, spacers are formed on gate structures (e.g., dummy gate structures). It should be understood that while replaceable dummy gates are preferred, permanent gates may alternately be formed early in the process. In one embodiment, forming spacers on dummy gate structures may include the following.

In block 104, a dummy dielectric (e.g., oxide) is formed on a substrate. In block 106, dummy gate structures are patterned on the dummy dielectric. This may include forming a layer of, e.g., polysilicon and patterning the polysilicon (e.g., using a hard mask and an etching process). In block 108, a spacer dielectric is deposited over the P-type device and over the N-type device. In block 110, the spacer dielectric is etched over the N-type device to form spacers. In block 112, the spacer dielectric is etched over the P-type device to form spacers. This is preferably performed after the formation of source and drain structures for the N-type device and the deposition of a protection layer over the N-type device and removal of the protection layer from the P-type device (in block 117).

In block 114, source and drain regions are grown adjacent to the spacers for an N-type device. The source and drain regions may be epitaxially grown from a substrate. In block 116, a protection layer is formed over the spacers and the source and drain regions of the N-type device. The protection layer may include SiN. The protection layer is removed from the P-type device in block 117.

In block 118, source and drain regions are grown adjacent to the spacers for a P-type device. The source and drain regions may be epitaxially grown from the substrate. In block 120, a first dielectric layer is conformally deposited. The first dielectric layer may include a thin high-k dielectric.

In block 122, the first dielectric layer is recessed to expose top portions of the spacers. This may include the following steps. In block 124, an organic planarizing layer (OPL) is deposited over the spacers. In block 126, the organic planarizing layer is recessed to a height along the spacers. In block 128, the first dielectric layer is etched above the height. In block 130, the organic planarizing layer may be removed by an ash process wherein the source and drain regions of the P-type device are protected from the ash process by the second dielectric layer, and the source and drain regions of the N-type device are protected from the ash process by the second dielectric layer and the protection layer.

In block 132, the dummy gate structures are exposed and removed to form gate openings. In block 134, gate dielectric and gate conductors are formed in the gate openings. In block 136, the first dielectric layer is removed to expose the source and drain regions adjacent to the spacers for the P-type device. In block 138, exposed source and drain regions adjacent to the spacers for the P-type device are silicided to form a silicided liner for the P-type device. The source and drain regions adjacent to the spacers for the P-type device may include a horizontal surface and a vertical surface and siliciding exposed source and drain regions adjacent to the spacers for the P-type device may include forming the silicided liner for the P-type device along the horizontal and vertical surfaces and protecting a portion of the horizontal surface and the vertical surface with the second dielectric layer.

In block 140, a second dielectric layer is conformally deposited. The second dielectric layer may include a high-k dielectric material. In block 142, a flowable dielectric fill is formed over the second dielectric layer. In block 144, contact holes are opened in the flowable dielectric and through the second dielectric layer to expose the silicided liner for the P-type device. In block 146, the source and drain regions are exposed adjacent to the spacers for the N-type device by opening the protection layer. In block 148, exposed source and drain regions adjacent to the spacers for the N-type device are silicided to form a silicided liner for the N-type device. The source and drain regions adjacent to the spacers for the N-type device may include a horizontal surface and a vertical surface and siliciding exposed source and drain regions adjacent to the spacers for the N-type device may include forming the silicided liner for the N-type device along a portion of the horizontal surface and protecting the remainder of the horizontal surface and the vertical surface with the protection layer.

In block 150, contacts are formed in the contact holes down to the silicided liners of the P-type device and the N-type device. Processing continues to complete the device as needed.

Having described preferred embodiments dual liner silicide (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for fabricating a dual silicide device, comprising:
   growing source and drain regions adjacent to a gate structure for a P-type device;
   siliciding exposed source and drain regions adjacent to the gate structure for the P-type device to form a silicided liner for the P-type device;
   forming a dielectric fill over a conformally deposited dielectric layer on a N-type device and the P-type device;
   opening contact holes in the dielectric fill and through the dielectric layer to expose the silicided liner for the P-type device and expose a protection layer for the N-type device;
   exposing source and drain regions adjacent to a gate structure for the N-type device by opening the protection layer; and
   siliciding exposed source and drain regions adjacent to the gate structure for the N-type device to form a silicided liner for the N-type device.

2. The method as recited in claim 1, wherein the gate structure for the N-type device and the P-type device is formed by:
   forming a dummy dielectric on a substrate;
   patterning dummy gate structures on the dummy dielectric;
   depositing a spacer dielectric over the P-type device and over the N-type device;
   etching the spacer dielectric over the N-type device to form spacers;
   etching the spacer dielectric over the P-type device to form spacers;
   removing the dummy gate structures to expose the substrate and form openings;
   forming a gate dielectric on the substrate in the openings; and
   forming a gate conductor on the gate dielectric in the openings.

3. The method as recited in claim 2, wherein removing the dummy gate structures includes:
   recessing the dielectric layer to expose top portions of the spacers; and
   exposing and removing the dummy gate structures to form the openings.

4. The method as recited in claim 3, wherein recessing the dielectric layer to expose top portions of the spacers includes:
   depositing an organic planarizing layer over the spacers;
   recessing the organic planarizing layer to a height along the spacers; and
   etching the dielectric layer above the height.

5. The method as recited in claim 4, further comprising removing the organic planarizing layer by an ash process wherein the source and drain regions of the P-type device are protected from the ash process by the dielectric layer and the source and drain regions of the N-type device are protected from the ash process by the dielectric layer and the protection layer.

6. The method as recited in claim 1, wherein the dielectric layer includes a high-k dielectric material.

7. The method as recited in claim 1, wherein the source and drain regions adjacent to the gate structure for the P-type device include a horizontal surface and a vertical surface and the step of siliciding exposed source and drain regions adjacent to the gate structure for the P-type device includes forming the silicided liner for the P-type device along the horizontal and vertical surfaces and protecting a portion of the horizontal surface and the vertical surface with the dielectric layer.

8. The method as recited in claim 1, wherein the source and drain regions adjacent to the gate structure for the N-type device include a horizontal surface and a vertical surface and the step of siliciding exposed source and drain regions adjacent to the gate structure for the N-type device includes forming the silicided liner for the N-type device along a portion of the horizontal surface and protecting the remainder of the horizontal surface and the vertical surface with the protection layer.

9. The method as recited in claim 1, further comprising forming contacts in the contact holes down to the silicided liners of the P-type device and the N-type device.

10. A method for fabricating a dual silicide device, comprising:
   forming a protection layer over source and drain regions of an N-type device and spacers on dummy gate structures;
   growing source and drain regions adjacent to the spacers for a P-type device;
   recessing a first dielectric layer on the N-type device and the P-type device to expose top portions of the spacers;
   exposing and removing the dummy gate structures to form gate openings;
   forming gate dielectric and gate conductors in the gate openings;
   removing the first dielectric layer to expose the source and drain regions adjacent to the spacers for the P-type device;
   siliciding exposed source and drain regions adjacent to the spacers for the P-type device to form a silicided liner for the P-type device;
   forming a flowable dielectric over a conformally deposited second dielectric layer on the spacers of the N-type device and the spacers of the P-type device;
   opening contact holes in the flowable dielectric and through the second dielectric layer to expose the silicided liner for the P-type device;
   exposing the source and drain regions adjacent to the spacers for the N-type device by opening the protection layer; and
   siliciding exposed source and drain regions adjacent to the spacers for the N-type device to form a silicided liner for the N-type device.

11. The method as recited in claim 10, wherein forming spacers on dummy gate structures includes:
   forming a dummy dielectric on a substrate;
   patterning the dummy gate structures on the dummy dielectric;
   depositing a spacer dielectric over the P-type device and over the N-type device;
   etching the spacer dielectric over the N-type device to form spacers; and
   etching the spacer dielectric over the P-type device to form spacers.

12. The method as recited in claim 11, wherein recessing the first dielectric layer to expose top portions of the spacers includes:
   depositing an organic planarizing layer over the spacers;
   recessing the organic planarizing layer to a height along the spacers; and
   etching the first dielectric layer above the height.

13. The method as recited in claim 12, further comprising removing the organic planarizing layer by an ash process wherein the source and drain regions of the P-type device are protected from the ash process by the second dielectric layer and the source and drain regions of the N-type device are protected from the ash process by the second dielectric layer and the protection layer.

14. The method as recited in claim 10, wherein the second dielectric layer includes a high-k dielectric material.

15. The method as recited in claim 10, wherein the source and drain regions adjacent to the spacers for the P-type device include a horizontal surface and a vertical surface and the step of siliciding exposed source and drain regions adjacent to the spacers for the P-type device includes forming the silicided liner for the P-type device along the horizontal and vertical surfaces and protecting a portion of the horizontal surface and the vertical surface with the second dielectric layer.

16. The method as recited in claim 10, wherein the source and drain regions adjacent to the spacers for the N-type device include a horizontal surface and a vertical surface and the step of siliciding exposed source and drain regions adjacent to the spacers for the N-type device includes forming the silicided liner for the N-type device along a portion of the horizontal surface and protecting the remainder of the horizontal surface and the vertical surface with the protection layer.

17. The method as recited in claim 10, further comprising forming contacts in the contact holes down to the silicided liners of the P-type device and the N-type device.

* * * * *